(12) United States Patent
Roohparvar

(10) Patent No.: US 7,561,466 B2
(45) Date of Patent: Jul. 14, 2009

(54) NON-VOLATILE MEMORY COPY BACK

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/049,942

(22) Filed: Mar. 17, 2008

(65) Prior Publication Data

US 2008/0212371 A1 Sep. 4, 2008

Related U.S. Application Data

(63) Continuation of application No. 11/215,993, filed on Aug. 30, 2005, now Pat. No. 7,362,611.

(51) Int. Cl.
*G11C 16/06* (2006.01)

(52) U.S. Cl. .............................. 365/185.09; 365/185.33; 365/200

(58) Field of Classification Search ............. 365/185.09, 365/185.01, 185.33, 200; 711/103; 714/763, 714/768

See application file for complete search history.

(56) References Cited

U.S. PATENT DOCUMENTS

| | | | |
|---|---|---|---|
| 6,041,374 A | 3/2000 | Postman et al. |
| 6,078,520 A | 6/2000 | Tobita et al. |
| 6,275,436 B1 | 8/2001 | Tobita et al. |
| 6,314,474 B1 | 11/2001 | Walter et al. |
| 6,421,279 B1 | 7/2002 | Tsunehiro et al. |
| 6,504,768 B1 | 1/2003 | Roohparvar et al. |
| 6,529,416 B2 | 3/2003 | Bruce et al. |
| 6,891,758 B2 | 5/2005 | Roohparvar et al. |
| 6,922,752 B2 | 7/2005 | Uysal et al. |
| 6,968,400 B2 | 11/2005 | Lasserre |
| 6,975,538 B2 | 12/2005 | Abedifard et al. |
| 6,975,542 B2 | 12/2005 | Roohparvar |
| 6,996,014 B2 | 2/2006 | Lee et al. |
| 7,072,232 B2 | 7/2006 | Shiota et al. |
| 7,274,607 B2 * | 9/2007 | Hartono et al. ............. 365/195 |
| 2005/0120163 A1 | 6/2005 | Chou et al. |
| 2006/0050576 A1 | 3/2006 | Kim |
| 2006/0156189 A1 | 7/2006 | Tomlin |
| 2006/0282755 A1 | 12/2006 | Oh |

OTHER PUBLICATIONS

"Micron Technical Note—Small Block vs Large Block NAND Flash Devices", (2005), 14 pgs.

* cited by examiner

*Primary Examiner*—Tuan T Nguyen
*Assistant Examiner*—Toan Le
(74) *Attorney, Agent, or Firm*—Schwegman, Lundberg & Woessner, P.A.

(57) ABSTRACT

Data move operations in a memory device are included that enable identification of data errors. During a write operation, identified errors are flagged and used to provide an error status during the data move operation. Results of the error detection can be accessed by a memory controller for data repair operations by the controller.

22 Claims, 2 Drawing Sheets

NON-VOLATILE MEMORY COPY BACK

RELATED APPLICATION(S)

This application is a Continuation of U.S. application Ser. No. 11/215,993, filed Aug. 30, 2005, now U.S. Pat. No. 7,362, 611, which is incorporated herein by reference.

FIELD OF THE INVENTION

The present invention relates to memory devices and more particularly to non-volatile memory internal data move operations.

BACKGROUND

Error detection and correction (ECC) engines are well known to those skilled in the art. An ECC engine is a device which performs a process of detecting errors and correcting the errors to ensure the accuracy and integrity of data during a data transmission. Different ECC engines are based on Hamming Code, Reed-Solomon Code or other techniques to correct for data errors.

In memory systems a memory controller typically writes data and ECC data to a memory device. The ECC data is used by the controller during a read operation to identify and correct errors that may have occurred since the data was written to the memory.

Memory devices can be categorized in two broad areas as volatile and non-volatile. Volatile memory devices require power to maintain data, while non-volatile memories are capable of maintaining data in the absence of a power supply.

SUMMARY

In one embodiment, a non-volatile memory device comprises an array of memory cells, and control circuitry to perform a write operation to store data in the array. The write operation includes a verify operation to determine if the stored data contains an error. The control circuitry stores an error flag in a storage location of the memory to indicate that the stored data contains an error.

In another embodiment, a non-volatile memory device comprises an array of memory cells, control circuitry to perform a write operation to store data in the array, and an error register to store an error flag to indicate that the stored data contains an error.

A method embodiment comprises performing an internal data move operation in a memory device. The data move operation includes moving data from a first storage location to a second storage location. An error flag corresponding to the data is read and a status is provided to an external controller indicating an error status of the data.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Embodiments of the present invention can include a semiconductor memory device having an array of memory cells. The memory cells are non-volatile, and can be charge trapping cells such as floating gate transistors or nitride read-only memory (NROM) cells, phase-change memory cells such as chalcogenide cells, programmable conductor random access memory (PCRAM), latching cells such as static RAM (SRAM), or magnetic random access memories (MRAM's). In addition, the memory cells can store one or more bits per cell.

Figure 1:
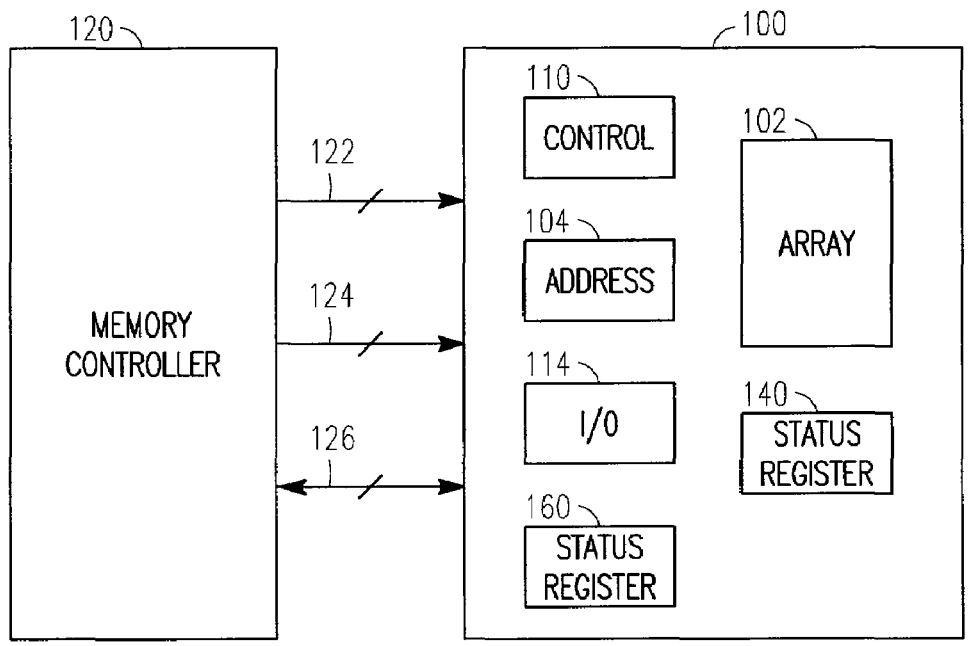
FIG. 1 is a block diagram of a memory system according to an embodiment of the invention.

FIG. 1 is a simplified block diagram of an integrated circuit dynamic memory device 100 in accordance with an embodiment of the invention. The memory device 100 includes an array of non-volatile memory cells 102, an address circuitry 104, and Input/Output (I/O) circuitry 114. In one embodiment the memory array is a NAND Flash memory array. In another embodiment, the memory array is a NOR Flash memory array.

A control circuit 110 is provided to manage memory operations, such as read, write and erase operations. As explained below, one memory operation performed by the memory control circuitry includes an internal data move operation.

The memory device 100 can be coupled to a controller 120 for accessing the memory array 102. The memory device 100 receives control signals across control lines 122 from the controller 120 to control access to the memory array 102. Access to the memory array 102 is directed to one or more target memory cells in response to address signals received across address lines 124. Once accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features.

In addition to general memory functions, control circuitry 110 performs a write operation to store data in the array. As explained below, the write operation comprises a verify operation to determine if the stored data contains an error. The control circuitry stores an error flag in a storage location of the memory to indicate that the stored data contains an error. Further, the control circuitry performs an internal data move operation wherein stored data is moved from a first array location to a second array location.

Prior art non-volatile memory devices often perform a verify operation while writing data to the memory. The verify operation checks the data to determine if it is correctly written to a cell. If the data is not correct, additional program functions are performed until the memory cell passes the verify step. If a cell does not properly program within a predetermined maximum number of program functions, the cell is often labeled as bad. In some memory devices, such as multilevel cells (MLC) which store multiple bits in a single cell, subjecting a memory cell to numerous program functions can result in errors and data disturb conditions to neighboring cells. To address these concerns a "pseudo pass" function has been provided.

The pseudo pass function is used to stop programming operations when the memory data being written is close to correct. That is, recognizing that the external memory controller can detect and correct multi-bit errors allows the memory to stop programming operations when the data is close to correct.

Non-volatile memory devices, such as Flash memories, often perform an internal data move operation. This operation is performed as part of "house keeping." That is, data stored in a first memory array location is moved to a second memory array location so that memory operations, such as memory cell erasing, can be performed on the first location. In prior art memory devices, the data is not read by the controller during the move operation. As such, the ECC circuitry of the controller is not employed during the move to determine if an error exists in the memory data.

Embodiments of the invention register the location of data that corresponds to a pseudo pass operation during programming. That is, if the data is not correctly written to the memory, a flag is set. As such, the external memory controller can be notified if an internal move operation is requested for data that corresponds to a set flag. The memory controller can then read the data, perform an error correction on the data and re-write the data to the memory.

The flag is stored in the memory and can be located in the array 102 or other storage location. For example, the flag data can be stored in an over-head location of the array, with the programmed data, or in a separate register 140 on the memory.

Figure 2:
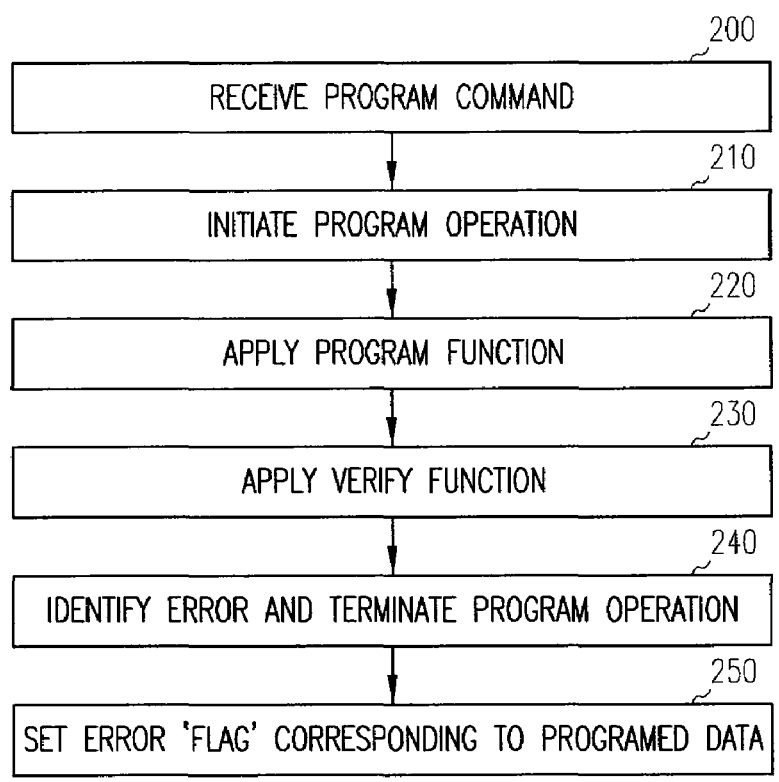
FIG. 2 is a flow chart illustrating embodiments of the present invention.

FIG. 2 is a flow chart illustrating embodiments of the present invention. In response to a program command 200 received by the memory controller, the memory initiates a program operation 210 to store originally provided data. During the program operation, at least one program 220 and verify 230 functions are performed. If the data is verified to contain errors but still be within a pre-determined accuracy of the original, the program operation is terminated 240 and an error flag is set 250. In one embodiment the error flag is stored in a memory cell(s) of the array.

Figure 3:
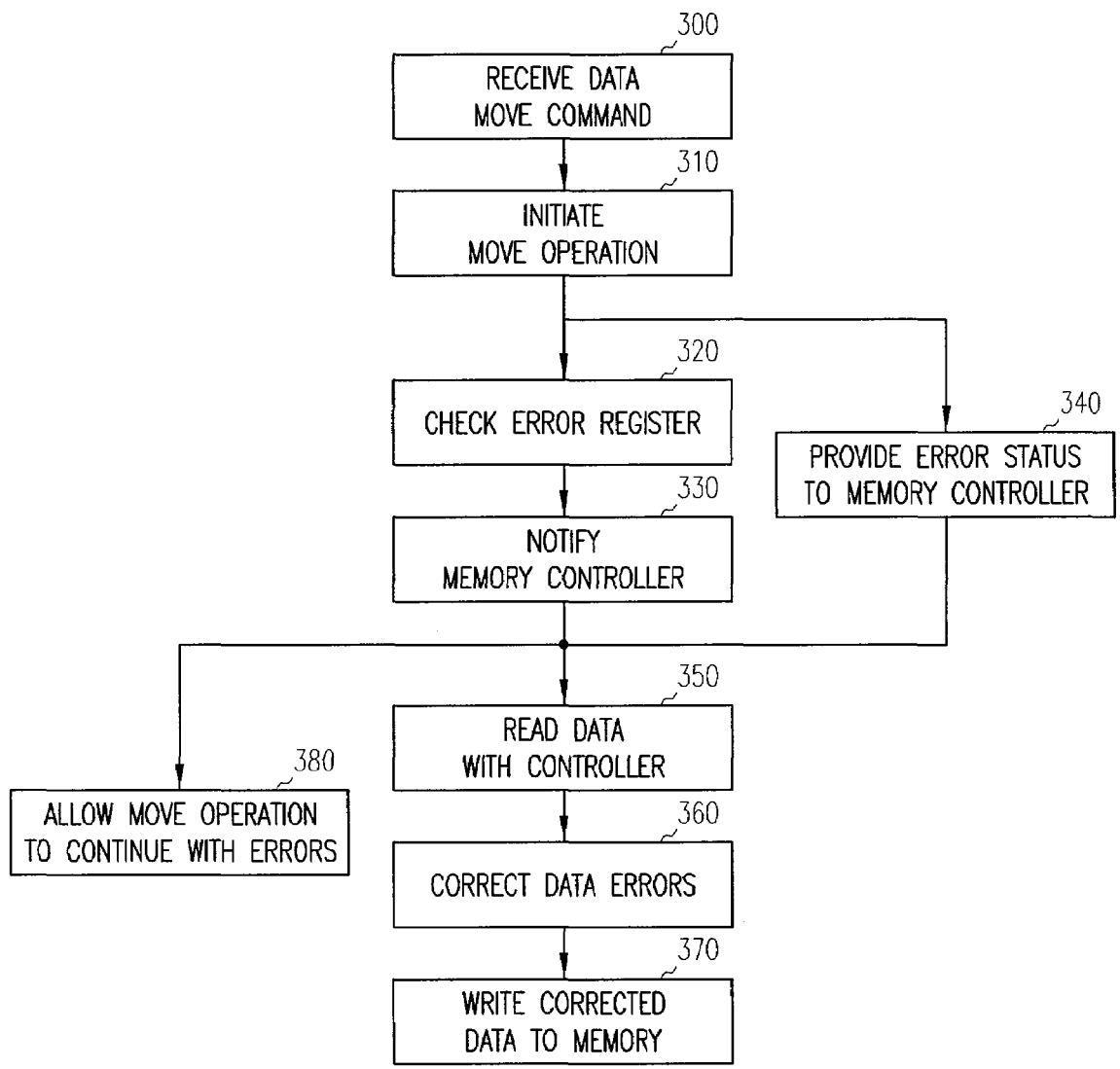
FIG. 3 is a flow chart illustrating additional embodiments of the present invention.

FIG. 3 is a flow chart illustrating embodiments of the present invention. In response to a data move command 300 received by the memory controller, the memory initiates a move operation 310 to move data from a first array location to a second array location. The memory checks the status of the error flag 320. If the error flag register is set to indicate the presence of an error in the data, a notification is provided to the memory controller 330. In one embodiment, the contents of error register 140 are provided in status register 160 (FIG. 1) readable by the controller 120. That is, the memory does not evaluate the error register but provides an error status to the memory controller 340.

In response to the notification, the memory controller reads the data 350 and performs an error correction operation 360 on the data. The memory controller then writes the corrected data back to the memory 370. In response to the notification 330 or error status 340, the memory controller can optionally allow the memory device to continue with the data move operation 380. In this embodiment the error(s) contained in the data will remain after the data move.

Data move operations in a memory device have been described that enable identification of data errors. During a write operation, identified errors are flagged and the flag is then used to provide an error status during a later performed data move operation. Results of the error detection can be accessed by a memory controller for data repair operations by the controller. The above embodiments can be particularly useful in MLC (multi-level cell) memory devices such as MLC NAND Flash devices.

The invention claimed is:

1. A method of operating a non-volatile flash memory device comprising:
   storing data at a first memory location using a pseudo pass function;
   setting a flag to indicate that a multi-level cell bit has been programmed via a pseudo pass function;
   moving data from the first memory array location to a second memory array location;
   erasing the first memory array location; and
   moving the data from the second memory array location to the first memory array location.

2. The method of claim 1, wherein moving the data from the second memory array location comprises giving the user the option through a user command to the copy back the data from the second memory location to the first memory location.

3. The method claim 1, wherein setting the flag comprises storing the flag of the pseudo pass function in a register.

4. The method of claim 1, wherein moving data comprises reading the flag with an external memory controller.

5. The method of claim 4, wherein reading the flag comprises using an output of the flag to correct the data via external data correction.

6. The method of claim 1, wherein setting the flag comprises setting the number of programs in the pseudo pass function by a user communicated value.

7. The method of claim 1, wherein moving data from the first memory location comprises using an output of the pseudo pass function for data correction during moving data from the first memory location.

8. The method of claim 1, wherein moving data from the second memory location comprises using an output of the pseudo pass function for data correction during moving data from the second memory location.

9. The method of claim 1, wherein storing data includes storing data in a memory cell device can store multiple bits of data per cell.

10. A method of operating a non-volatile, multi-level cell memory device, comprising:
    storing data at a first memory location using a pseudo pass function;
    storing in a register a pseudo pass function programming flag;
    moving, internally in the device, multi-level data from the first memory array location to a second memory array location;
    erasing the first memory array location; and
    moving the data from the second memory array location to the first memory array location.

11. The method of claim 10, wherein erasing comprises preventing data disturb condition in the first memory array location 12. The method of claim 10, wherein moving from the first memory array location includes reading the moved data.

13. The method of claim 10, wherein moving from the first memory array location includes performing error correction on moved data.

14. The method of claim 10, wherein moving from the first memory array location includes reading, in a controller, the stored programming flag, and instructing, if a certain flag value is read, a memory controller to read the data and perform error correction.

15. The method of claim 14, wherein storing data includes storing data in a NAND Flash memory array.

16. A method of operating a non-volatile, multi-level cell memory device, comprising:
- performing a pseudo pass function on data at a first memory location;
- writing an error flag in an error register to indicate a location of error data, if any, within the first memory location;
- moving, internally in the device, multi-level data from the first memory array location to a second memory array location;
- erasing the first memory array location; and
- moving the data from the second memory array location to the first memory array location.

17. The method of claim 16, wherein reading the flag comprises using an output of the flag to correct the data via an external data correction.

18. The method of claim 16, wherein writing an error flag comprises setting the number of programs in the pseudo pass function by a user communicated value.

19. The method of claim 16, wherein moving data from the first memory location comprises using an output of the pseudo pass function for data correction during moving data from the first memory location.

20. The method of claim 16, wherein moving from the first memory array location includes performing error correction on moved data.

21. The method of claim 16, wherein moving from the first memory array location includes reading, in a controller, the stored programming flag, and instructing, if a certain flag value is read, a memory controller to read the data and perform error correction.

22. The method of claim 16, wherein performing a pseudo pass function includes performing a pseudo pass function in a NOR flash memory array.

* * * * *

UNITED STATES PATENT AND TRADEMARK OFFICE
CERTIFICATE OF CORRECTION

| | |
|---|---|
| PATENT NO. | : 7,561,466 B2 |
| APPLICATION NO. | : 12/049942 |
| DATED | : July 14, 2009 |
| INVENTOR(S) | : Frankie F. Roohparvar |

It is certified that error appears in the above-identified patent and that said Letters Patent is hereby corrected as shown below:

In column 4, line 60, in Claim 11, after "location" insert --.--.

Signed and Sealed this

First Day of September, 2009

David J. Kappos
*Director of the United States Patent and Trademark Office*